United States Patent [19]
Miyajima et al.

[11] Patent Number: 5,976,936
[45] Date of Patent: Nov. 2, 1999

[54] SILICON CARBIDE SEMICONDUCTOR DEVICE

[75] Inventors: Takeshi Miyajima, Kariya; Norihito Tokura, Okazaki; Kazukuni Hara, Obu; Hiroo Fuma, Gifu, all of Japan

[73] Assignee: Denso Corporation, Kariya, Japan

[21] Appl. No.: 08/893,221

[22] Filed: Jul. 15, 1997

Related U.S. Application Data

[62] Division of application No. 08/708,582, Sep. 5, 1996.

[30] Foreign Application Priority Data

| Sep. 6, 1995 | [JP] | Japan | 7-229485 |
| Sep. 6, 1995 | [JP] | Japan | 7-229486 |
| Sep. 6, 1995 | [JP] | Japan | 7-229487 |

[51] Int. Cl.$^6$ ............ H01L 21/336; H01L 21/8234
[52] U.S. Cl. ............ 438/268; 438/275; 438/981
[58] Field of Search ............ 438/268, 981, 438/275

[56] References Cited

U.S. PATENT DOCUMENTS

| 4,859,621 | 8/1989 | Einthoven . |
| 5,170,231 | 12/1992 | Fuji . |
| 5,233,215 | 8/1993 | Baliga . |
| 5,323,040 | 6/1994 | Baliga . |
| 5,389,799 | 2/1995 | Uemoto . |
| 5,396,085 | 3/1995 | Baliga . |
| 5,399,515 | 3/1995 | Davis . |
| 5,451,797 | 9/1995 | Davis . |
| 5,506,421 | 4/1996 | Palmour . |
| 5,514,604 | 5/1996 | Brown . |
| 5,574,295 | 11/1996 | Kurtz . |
| 5,614,749 | 3/1997 | Vend . |
| 5,723,376 | 3/1998 | Takeuchi . |
| 5,744,826 | 4/1998 | Takeuchi et al. ............ 257/77 |

FOREIGN PATENT DOCUMENTS

| 0 656 661 A1 | 6/1995 | European Pat. Off. . |
| 0 657 947 A1 | 6/1995 | European Pat. Off. . |
| 676814 | 10/1995 | European Pat. Off. . |
| 3-6060 | 1/1991 | Japan . |
| 4-239778 | 8/1992 | Japan . |
| 5-102497 | 4/1993 | Japan . |
| 5-259443 | 10/1993 | Japan . |
| 7-131016 | 5/1995 | Japan . |
| 0 657 992 A1 | 6/1995 | Japan . |

OTHER PUBLICATIONS

Spencer et al., "Silicon Carbide and Related Materials", Inst. Phys. Conf. Ser. No. 137, Nov. 1–3, 1993, pp. 55–58.

"Electronic Components and Circuits", NASA Tech Briefs, Feb. 1995, various pages Month Unknown.

Palmour et al., "Proceedings of the 28th Intersociety Energy Conversion Engineering Conference", American Chemical Society, 1993, pp. 1249–1254 Month Unknown.

Suzuki et al., "Thermal Oxidation of SiC and Electrical Properties of Al–SiO$_2$–SiC MOS Structure", Japanese Journal of Applied Physics, vol. 21, No. 4, Apr. 1982, pp. 579–585.

(List continued on next page.)

*Primary Examiner*—Richard A Booth
*Assistant Examiner*—Michael S. Lebentritt
*Attorney, Agent, or Firm*—Pillsbury Madison & Sutro LLP

[57] ABSTRACT

A silicon carbide semiconductor device having a high blocking voltage, low loss, and a low threshold voltage is provided. An n$^+$ type silicon carbide semiconductor substrate 1, an n$^-$ type silicon carbide semiconductor substrate 2, and a p type silicon carbide semiconductor layer 3 are successively laminated on top of one another. An n$^+$ type source region 6 is formed in a predetermined region of the surface in the p type silicon carbide semiconductor layer 3, and a trench 9 is formed so as to extend through the n$^+$ type source region 6 and the p type silicon carbide semiconductor layer 3 into the n$^-$ type silicon carbide semiconductor layer 2. A thin-film semiconductor layer (n type or p type) 11a is extendedly provided on the surface of the n$^+$ type source region 6, the p type silicon carbide semiconductor layer 3, and the n$^-$ type silicon carbide semiconductor layer 2 in the side face of the trench 9.

10 Claims, 10 Drawing Sheets

OTHER PUBLICATIONS

"Thermal Oxidation Characteristics of 6H–SiC and Field Effect Characteristics of Vertical $SiO_2$/6H–SiC Interface" (Seminar an SiC and Related Wide Gap Semiconductors, Proceedings of 3rd Meeting) & "Relevancy with Present Invention" (Applicant's Comments) Date Unknown.

Patent Abstract of Japan, vol. 017 No. 006 (E–1302) re JP–A 04–239778 Jan. 1993.

Patent Abstract of Japan, vol. 014, No. 288 (E–0943) re JP–A 02–091976, Jun. 1990.

Jayant Baliga B, "Critical Nature of Oxide/Interface Quality for SIC Power Devices", Microelectronic Engineering, vol. 28 No. 1/Jun. 4, 1995 p. 182.

SILICON CARBIDE SEMICONDUCTOR DEVICE

This is a division of application Ser. No. 08/708,582, filed Sep. 5, 1996.

BACKGROUND OF THE INVENTION

1. Field of the Invention

The present invention relates to a silicon carbide semiconductor device such as, for example, an insulated gate type field effect transistor and especially a high-power vertical MOSFET.

2. Description of the Related Art

In recent years, vertical power MOSFETs prepared using a single crystal of silicon carbide have been used as power transistors. In order to reduce the occurrence of loss in the power transistor, it is necessary to reduce the ON resistance. For this purpose, a trench gate type power MOSFET, as shown in FIG. 16, has been proposed as a device capable of effectively reducing the ON resistance (for example, Japanese Unexamined Patent Publication (Kokai) No. 4-239778). In the trench gate type power MOSFET shown in FIG. 16, an n type epitaxial layer 22 is provided on an n type silicon carbide semiconductor substrate 21, a p type epitaxial layer 23 is provided on the n type epitaxial layer 22 and an n type source region 24 is provided in the p type epitaxial layer 23 in a predetermined region. Further, a trench 25 is provided which extends through the n type source region 24 and the p type epitaxial layer 23 into the n type epitaxial layer 22. A gate electrode 27 is provided on the gate insulating layer 26 within the trench 25. An insulating layer 28 is provided on the upper surface of the gate electrode 27, a source electrode 29 is formed on the n type source region 24 including the surface of the insulating layer 28, and a drain electrode 30 is formed on the surface of the n type silicon carbide semiconductor substrate 21.

In this case, a channel through which a carrier is allowed to flow between the source terminal and the drain terminal has been formed by applying a voltage to the gate electrode 27 to produce an electric field in the gate insulating layer 26 sandwiched between the gate electrode 27 and the p type epitaxial layer 23 in the side wall portion of the trench 25, thereby reversing the conductivity type of the p type epitaxial layer 23 in contact with the gate insulating layer 26.

A vertical power MOSFET, as shown in FIG. 17, which induces a channel by an accumulation mode has been proposed as a device which can be prepared using single crystal silicon carbide and is capable of reducing the ON resistance (U.S. Pat. No. 5,323,040). The vertical power MOSFET shown in FIG. 17 is constructed as follows. An n$^+$ type drain region 33 is formed on a first surface 32a of a silicon carbide semiconductor substrate 31, and an n type silicon carbide semiconductor drift region 34 is provided more inward than the n$^+$ type drain region 33. An n$^+$ type source region 35 is provided on a second surface 32b of the silicon carbide semiconductor substrate 31, and an n type silicon carbide semiconductor channel region 36 is provided between the n$^+$ type source region 35 and the n$^-$ type silicon carbide semiconductor drift region 34. Further, a trench 37 which extends into the n$^-$ type silicon carbide semiconductor drift region 34 is provided on the second surface 32b of the silicon carbide semiconductor substrate 31, thus providing a mesa region 38 including the n$^+$ type source region 35 and the n$^-$ type silicon carbide semiconductor channel region 36. An insulating layer 39 is provided along the side face 37a of the trench 37 and the bottom face 37b of the trench 37. The trench 37 is filled with a gate electrode 40. A source electrode 41 and a drain electrode 42 are provided respectively on the n$^+$ source region 35 and the n$^+$ type drain region 33.

In this case, carrier conduction between the source terminal and the drain terminal has been conducted by applying a positive voltage to the gate electrode 40 to create an n type accumulation layer channel 43 in the vicinity of the side face 37a in the n$^-$ type silicon carbide semiconductor channel region 36. The work function of the gate electrode 40, the impurity concentration of the n$^-$ type silicon carbide semiconductor channel region 36, and the width W of the mesa region 38 are designed so that the mesa region 38 is depleted when no voltage is applied to the gate electrode 40. Therefore, when no voltage or a negative voltage is applied to the gate electrode 40, carrier conduction is less likely to occur between the source terminal and the drain terminal.

Thus, in the vertical power MOSFET shown in FIG. 17, induction using a channel accumulation mode lowers the threshold voltage, and reduction in size of the unit cell 44 (reduction in width W of the mesa region 38 to about 2 μm) increases the integration to lower the ON resistance.

In the trench gate type power MOSFET shown in FIG. 16, the impurity concentration of the region where the channel is formed has been specified by the impurity concentration of the p type epitaxial layer 23. This poses the following problems. The concentration $N_A$ of impurities in the p type epitaxial layer 23 and the distance (thickness) a between the source region 24 and the n type epitaxial layer 22 are among parameters determining the blocking voltage across the source and the drain of the power MOSFET shown in FIG. 16. The blocking voltage across the source and drain is governed by avalanche conditions for pn junction between the p type epitaxial layer 23 and the n type epitaxial layer 22 and conditions under which the p type epitaxial layer 23 is depleted to create punch-through. For this reason, the impurity concentration NA of the p type epitaxial layer 23 should be satisfactorily high, and the thickness a should also be satisfactorily large. Increasing the impurity concentration NA of the p type epitaxial layer 23 unfavorably results in increased gate threshold voltage. Further, this increases scattering of the impurities and, hence, lowers the channel mobility, unfavorably increasing the ON resistance. On the other hand, increasing the thickness a increases the channel length, unfavorably increasing the ON resistance.

Thus, in order to realize a power MOSFET having high blocking voltage, low current loss during operation, and low threshold voltage, the impurity concentration of the p type epitaxial layer should be regulated independently of the impurity concentration of the region where the channel is formed. However, it is difficult to attain this by the conventional structure and production process.

Lowering the concentration of the channel forming layer by thermal diffusion has been used, in the trench gate type power MOSFET using single crystal silicon, as one means to solve the above problem. In the trench gate type power MOSFET using silicon carbide, however, the coefficient of the thermal diffusion of impurity atoms in silicon carbide is very small, posing a new problem in that the thermal diffusion cannot be used.

Further, in the vertical MOSFET shown in FIG. 17, since the breakdown of the device is determined by the blocking voltage of the insulating layer in the bottom face of the trench, the blocking voltage is lower than that of devices wherein the blocking voltage is determined by the avalanche breakdown of the pn junction. Further, during OFF state of the transistor, under high temperature conditions, a large number of carriers are supplied from the n⁺ type source region 35 to the n⁻ type silicon carbide semiconductor region 36, unfavorably creating a high leakage current between the source and the drain.

When the trench 25 is formed by dry etching, damage to the channel formed face occurs by ion etching, deteriorating the MOS interface properties and, hence, deteriorating the MOS switching properties.

SUMMARY OF THE INVENTION

The first object of the present invention is to provide a silicon carbide semiconductor device having high blocking voltage, low loss, and low threshold voltage.

The second object of the present invention is to provide a silicon carbide semiconductor device having high blocking voltage, low loss, low threshold voltage, and low leakage current.

The third object of the present-invention is to further improve-the high blocking voltage and low loss and low threshold voltage and, further, improve the MOS interface properties by reducing ion damage and irregularities of the channel formed face and to provide a silicon carbide semiconductor device having excellent switching properties.

The first invention provides a silicon carbide semiconductor device comprising;

a semiconductor substrate comprising a first conductive type low-resistance semiconductor layer, a first conductive type high-resistance semiconductor layer, and a second conductive type first semiconductor layer laminated in that order on top of one another, the semiconductor substrate being formed of a single crystal silicon carbide;

a first conductive type semiconductor region provided in a predetermined region of the surface portion in the first semiconductor layer;

a trench extending through the semiconductor region and the first semiconductor layer into the high-resistance semiconductor layer;

a second semiconductor layer extendedly provided on the surface of the semiconductor region, the first semiconductor layer, and the high-resistance semiconductor layer in the side face of the trench, the second semiconductor layer comprising a thin layer of silicon carbide;

a gate insulating layer provided on the surface of the second semiconductor layer in the trench;

a gate electrode layer provided on the surface of the gate insulating layer within the trench;

a first electrode layer provided on the surface of a part of the semiconductor region and optionally on the surface of the first semiconductor layer; and a second electrode formed on the surface of the low-resistance semiconductor layer.

By virtue of the above construction, when a voltage is applied to the gate electrode layer (gate terminal) to produce an electric field in the gate insulating layer, a channel is formed in the second semiconductor layer, permitting a carrier to flow between the first electrode layer (source terminal) and the second electrode layer (drain terminal). That is, the second semiconductor layer becomes a channel forming region.

In this case, a silicon carbide semiconductor device having a high blocking voltage, a low current loss, and a low threshold voltage can be provided by independently regulating the impurity concentration of the first semiconductor layer (body layer) and the impurity concentration of the second semiconductor layer. More specifically, since the blocking voltage across the source and the drain is mainly governed by the impurity concentration and thickness of the high-resistance semiconductor layer, the impurity concentration of the first semiconductor layer, and the distance L between the high-resistance semiconductor layer and the semiconductor region, and the distance L between the high-resistance semiconductor layer and the semiconductor region can be shortened by increasing the impurity concentration of the first semiconductor layer. The distance L between the high-resistance semiconductor layer and the semiconductor region is substantially equal to the channel length. Thus, the channel length can be decreased while maintaining the high blocking voltage, providing a silicon carbide semiconductor device having high blocking voltage and low current loss. Further, the impurity concentration of the second semiconductor layer, in which the channel is formed, can be lowered, enabling the influence of scattering of impurities during the flow of the carrier to be reduced and, therefore, enabling the channel mobility to be increased. By virtue of this, a silicon carbide semiconductor device having high blocking voltage and low current loss can be realized.

The crystalline form of silicon carbide constituting the first semiconductor layer may be different from that of silicon carbide constituting the second semiconductor layer where the channel is formed. Therefore, a silicon carbide semiconductor device having a low current loss can be provided by bringing the crystalline form constituting the second semiconductor layer, where the channel is formed, to such a crystalline form that the mobility in the carrier flow direction is larger than that in the case of the first semiconductor layer.

When the crystalline form of the second semiconductor layer is the same as that of the first semiconductor layer, the device structure contemplated in the present invention can be easily provided.

When the surface of the semiconductor substrate has a carbon face with a substantially (000$\bar{1}$) face orientation, a structure having high blocking voltage can be easily provided.

When the second semiconductor layer is of the second conductive type and has a lower impurity concentration than the first semiconductor layer, the channel resistance can be decreased.

In the second invention, the second semiconductor layer is of the first conductive type. In this case, when the MOSFET operation mode is an accumulation mode wherein the channel is induced without inverting the conductive type of the channel forming layer, as compared with the inversion mode MOSFET wherein the channel is induced by inverting the conductive type, the MOSFET can be operated a lower gate voltage and, at the same time, the channel mobility can be increased, enabling a silicon carbide semiconductor device having low current loss and low threshold voltage to be provided.

When the gate voltage is not applied, the source/drain current is regulated by widening of the depletion layer of the pn junction formed by the body layer, i.e., the first semiconductor layer, and the channel forming layer, i.e., the second semiconductor layer, and the normally OFF properties are achieved by completely depleting the second semiconductor layer.

Since the body layer, i.e., the first semiconductor layer, and the drift layer, i.e., the high-resistance semiconductor layer, form a pn junction, the blocking voltage of the device can be designed so as to be determined by the avalanche breakdown of pn junction between the body layer fixed to the source electrode and the drift layer, enabling the breakdown voltage to be increased.

The leak current between the source and the drain can be decreased under high temperature conditions by lowering the impurity concentration of the second semiconductor layer, wherein the channel is formed, and, further, by reducing the thickness of the second semiconductor layer.

Further, when the impurity concentration of the second semiconductor layer is lower than the impurity concentration of the low-resistance semiconductor layer and the semiconductor region, the channel resistance can be lowered.

In the third invention, in the first step, a first conductive type low-resistance semiconductor layer, a first conductive type high-resistance semiconductor layer, and a second conductive type first semiconductor layer are laminated in that order on top of one another to form a semiconductor substrate of a single crystal of silicon carbide, and a first conductive type semiconductor region is formed in a predetermined region of the surface layer portion in the first semiconductor layer. In the second step, a trench extending through the semiconductor region and the first semiconductor layer into the high-resistance semiconductor layer is formed, and, in the third step, a second semiconductor layer, formed of a single crystal silicon carbide, is formed on at least the side face of the inner wall of the trench. In the fourth step, a gate oxide layer is formed on the surface of the second semiconductor layer in the trench. In the fifth step, a gate electrode layer is formed on the surface of the gate oxide film in the trench. In the sixth step, a first electrode is formed on the surface of the semiconductor region and optionally on the surface of the first semiconductor layer, and a second electrode is formed on the surface of the low-resistance semiconductor layer.

Thus, the formation of the high-resistance semiconductor layer and the first semiconductor layer in the first step is carried out independently of the formation of the second semiconductor layer in the third step. Therefore, the impurity concentration of the second semiconductor layer wherein the channel is formed can be designed and may be brought to a desired value, independently of the concentration of an impurity in the high-resistance semiconductor layer and the first semiconductor layer necessary for the design of the blocking voltage across the source and the drain. As a result, it is possible to provide a high blocking voltage and low-loss power MOSFET which has a lowered voltage drop in the channel portion by virtue of suppressed impurity scattering in the channel mobility and a low threshold voltage.

Since the second semiconductor layer is formed within the trench in the third step, a semiconductor layer free from ion damage can be provided in the second semiconductor layer. Thus, reduced ion damage and irregularities on the channel formed face can provide a silicon carbide semiconductor device having improved MOS interface properties and excellent switching properties.

When the silicon carbide constituting the semiconductor substrate is of a hexagonal system with the surface thereof having a carbon face with a substantially $(000\bar{1})$ face orientation, the chemical reactivity of the surface is higher than that of the other faces, enabling the process temperature to be lowered and, at the same time, the process time to be shortened.

In the third step, when the second semiconductor layer is formed on the surface of the first semiconductor layer and the semiconductor region and the side face and bottom of the trench and, thereafter, the second semiconductor layer on the surface of the first semiconductor layer and the semiconductor region and the bottom of the trench is thermally oxidized deeper than the second semiconductor layer on the side face of the trench to leave the second semiconductor layer on only the side face of the trench, the oxide layer on the side face of the trench can be formed thin while the oxide layer on the surface of the substrate and on the bottom face of the trench can be formed thick. This is based on the finding, through experiments conducted by the present inventors, of the anisotropy in the oxidation of SiC as shown in FIG. 9. The step of anisotropic oxidation enables the unnecessary second semiconductor layer on the surface of the substrate and on the bottom face of the trench to be removed while minimizing the removal of the necessary second semiconductor layer. By virtue of this effect, the second semiconductor layer can be formed on only the side face of the trench by single thermal oxidation in a simple manner at a high yield.

In the third step, when the second semiconductor layer is formed by epitaxial growth, a high-quality semiconductor layer can be uniformly formed on the side face of the trench. The mobility of the second semiconductor layer formed by this method is not influenced by the impurities of the other layers and, hence, is high. This can lower the drop voltage in the channel portion created in the second semiconductor layer, resulting in the provision of a low-loss semiconductor device.

In the first step, when the semiconductor region is formed by epitaxial growth, a thick source region can be formed. Further, a low-resistance source region can be formed by epitaxial growth.

In the second step, when the trench is formed by dry etching and, in the inner wall of the trench, the oxide layer with the thickness thereof on the side face is smaller than that on the bottom face is formed and removed the use of local anisotropic thermal oxidation to form a relatively thin oxide layer and the formation of a trench free from ion damage on the inner wall of the trench enables a high-quality second semiconductor layer to be formed on the side face of the trench, offering the creation of good MOS interface in the second semiconductor layer. This enables the production of a semiconductor device having excellent switching properties.

In the third step, when a second semiconductor layer is formed on the inner wall of the trench by anisotropic epitaxial growth so that the thickness of the layer on the side face is larger than that of the layer on the bottom face, that is, when the second semiconductor layer is formed by anisotropic epitaxial growth, the homoepitaxial growth can be achieved on the side face of the trench and at the same time, the epitaxial layer on the side face of the trench is grown to a thickness 10 times larger than the thickness of the epitaxial layer on the surface of the substrate and on the bottom face of the trench. This is based on the finding, obtained through experiments conducted by the present inventors, of the epitaxial growth rate of silicon carbide as shown in FIG. 10. By virtue of this effect, the voltage drop in the channel portion can be reduced, and, further, the semiconductor device can be formed in a high yield.

In the fourth step, when a gate oxide layer is formed on the inner wall of the trench by anisotropic thermal oxidation so that the thickness of the layer on the side face is smaller than that of the layer on the bottom face the formation of the gate oxide layer by thermal oxidation can offer a MOS gate structure. In this method, the thickness of the oxide layer on the side face can be selectively reduced with the thickness of the field oxide layer on the surface of the substrate and on the bottom face of the trench being increased. Thus, a thin oxide layer can be formed on only a site where the channel is created. Therefore, it is possible to provide a semiconductor device which has high blocking voltage across the source and the drain and a high switching rate.

DESCRIPTION OF THE PREFERRED EMBODIMENTS

Embodiments of the present invention will be described in more detail with reference to the accompanying drawings.

EXAMPLE 1

Figure 1:
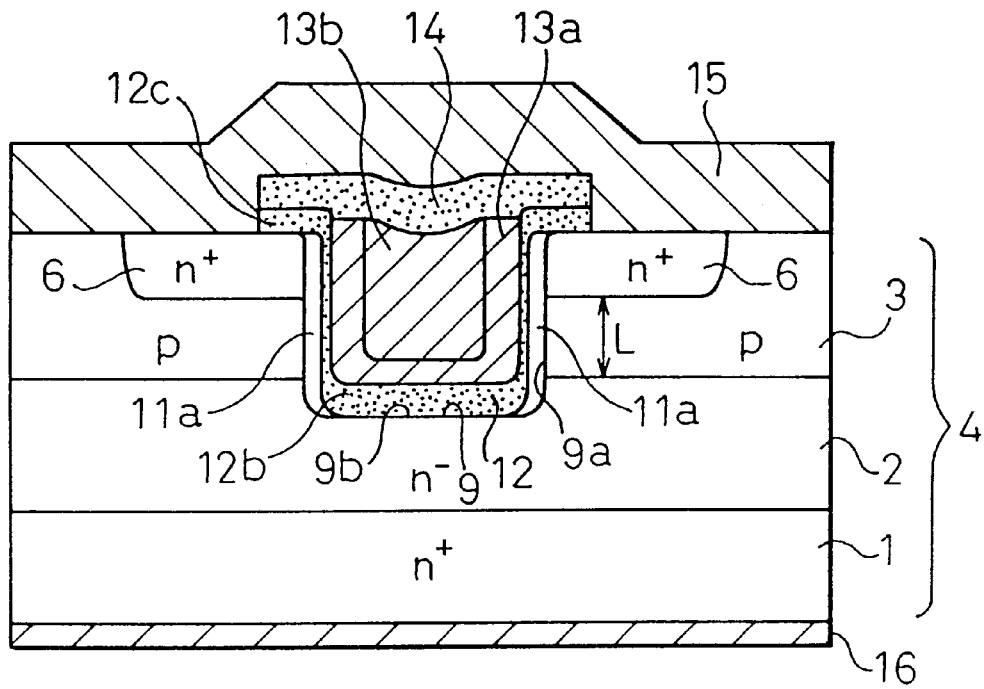
FIG. 1 is a cross-sectional view showing the structure of a silicon carbide semiconductor device according to a first embodiment of the present invention.

FIG. 1 is a cross-sectional view of an n channel type trench gate type power MOSFET (vertical power MOSFET) according to one embodiment of the present invention.

An $n^+$ type single crystal silicon carbide semiconductor substrate 1 as a low-resistance semiconductor layer is formed of silicon carbide of a hexagonal system. An $n^-$ type silicon carbide semiconductor layer 2 as a high-resistance semiconductor layer and a p type silicon carbide semiconductor layer 3 as a first semiconductor layer are successively laminated on the $n^+$ type silicon carbide semiconductor substrate 1.

Thus, a semiconductor substrate 4 of single crystal silicon carbide comprises an $n^+$ type silicon carbide semiconductor substrate 1, an $n^-$ type silicon carbide semiconductor layer 2 and a p type silicon carbide semiconductor layer 3, and the upper surface thereof has a carbon face with a substantially ($000\overline{1}$) face orientation.

An $n^+$ type source region 6 is provided as a semiconductor region in a predetermined region in the surface layer portion of the p type silicon carbide semiconductor layer 3. Further, a trench 9 is provided in a predetermined position of the $n^+$ type source region 6. This trench 9 extends through the $n^+$ type source region 6 and the p type silicon carbide semiconductor layer 3 into the $n^-$ type silicon carbide semiconductor layer 2. The trench 9 has a side face 9a perpendicular to the surface of the semiconductor substrate 4 and a bottom face 9b parallel to the surface of the semiconductor substrate 4.

Figure 17:
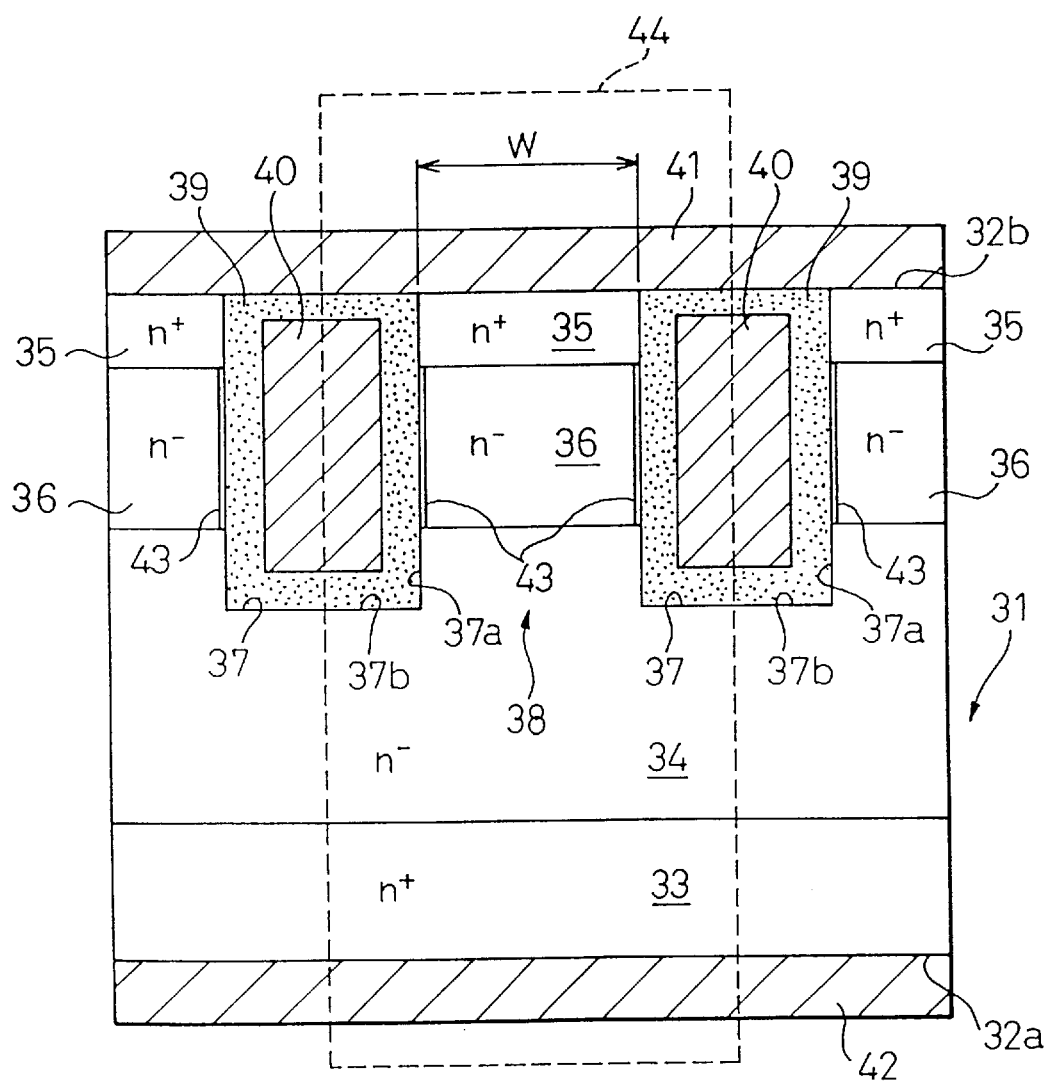
FIG. 17 is a cross-sectional view showing the structure of a conventional silicon carbide semiconductor device.

A thin n type silicon carbide semiconductor layer 11a is extendedly provided as a second semiconductor layer on the surface of the $n^+$ type source region 6, the p type silicon carbide semiconductor layer 3, and the $n^-$ type silicon carbide semiconductor layer 2 in the side face 9a of the trench 9. The thickness of the thin n type silicon carbide semiconductor layer 11a is a thin film having a thickness of about 1000 to 5000 Å which is smaller than the width W=2 $\mu$m of a mesa region 38 in a device shown in Fig. 17. The crystalline form of the thin n type silicon carbide semiconductor layer 11a is the same as that of the p type silicon carbide semiconductor layer 3 and is, for example, 6H-SiC. It may be 4H-SiC or 3C-SiC. The impurity concentration of the thin n type silicon carbide semiconductor layer 7 is lower than that of the $n^+$ type silicon carbide semiconductor substrate 1 and the $n^+$ type source region 6.

Further, in the trench 9, a gate insulating layer 12 is provided on the surface of the thin n type silicon carbide semiconductor layer 11a and on the bottom face 9b of the trench 9. Gate electrode layers 13a, 13b are filled inside the gate insulating layer 12 within the trench 9. The gate electrode layers 13a, 13b are covered with an insulating layer 14. A source electrode layer 15 is provided as a first electrode layer on the surface of the $n^+$ type source region 6 and on the surface of the low-resistance p type silicon carbide region 3. A drain electrode layer 16 is provided as a second electrode layer on the surface (back side of the semiconductor substrate 4) of the $n^+$ type silicon carbide semiconductor substrate 1.

In the operation of the trench gate type power MOSFET, the application of a positive voltage to the gate electrode layers 13a, 13b induces an accumulation type channel in the thin n type silicon carbide semiconductor layer 11a, permitting a carrier to flow between the source electrode layer 15 and the drain electrode layer 16. That is, the thin n type silicon carbide semiconductor layer 11a serves as a channel forming region.

In this case, when the impurity concentration of the p type silicon carbide semiconductor layer 3 is regulated independently of the impurity concentration of the thin n type silicon carbide semiconductor layer 11a, a MOSFET having a high blocking voltage, a low current loss, and a low threshold value can be provided. In particular, when the impurity concentration of the thin n type silicon carbide semiconductor layer 11a wherein the channel is formed is low, the influence of impurity scattering at the time of flow of the carrier is reduced, increasing the channel mobility. Since the blocking voltage across the source and the drain is governed mainly by the impurity concentration and thickness of the $n^-$ type silicon carbide semiconductor layer 2 and the p type silicon carbide semiconductor layer 3, the impurity concentration of the p type silicon carbide semiconductor layer 3 can be increased to shorten the distance L between the high-resistance semiconductor layer and the semiconductor region, thus enabling the channel length to be shortened while maintaining the high blocking voltage. This in turn results in markedly lowered channel resistance and lowered ON resistance across the source and the drain.

In the case of the accumulation mode wherein the channel is induced as the MOSFET operation mode, as compared with an inversion mode MOSFET wherein the conductive type is inverted to induce the channel, the MOSFET can be operated at a lower gate voltage and, at the same time, the channel mobility can be increased, realizing low threshold voltage while enjoying low current loss. When the voltage is not applied, the regulation of the source/drain current is conducted by widening the depletion layer of the pn junction formed by the p type silicon carbide semiconductor layer 3 (body layer) and the thin n type silicon carbide semiconductor layer 11a (channel forming layer). The normally OFF properties can be achieved by completely depleting the thin n type silicon carbide semiconductor layer 11a. Further, since the p type silicon carbide semiconductor layer 3 (body layer) and the n⁻ type silicon carbide semiconductor layer 2 (drift layer) form a pn junction, the blocking voltage of the device can be designed so as to be determined by the avalanche breakdown of the pn junction between the p type silicon carbide semiconductor layer 3 fixed to the source electrode and the n⁻ type silicon carbide semiconductor layer 2, enabling the breakdown voltage to be increased. Further, the leakage current between the source and the drain can be decreased even under high temperature conditions by lowering the impurity concentration of the thin n type silicon carbide semiconductor layer 11a, wherein the channel is formed, and, further, reducing the thickness thereof to about 1000 to 5000 Å.

Next, a process for producing a trench gate type MOSFET will be described with reference to FIGS. 2 to 8.

Figure 2:
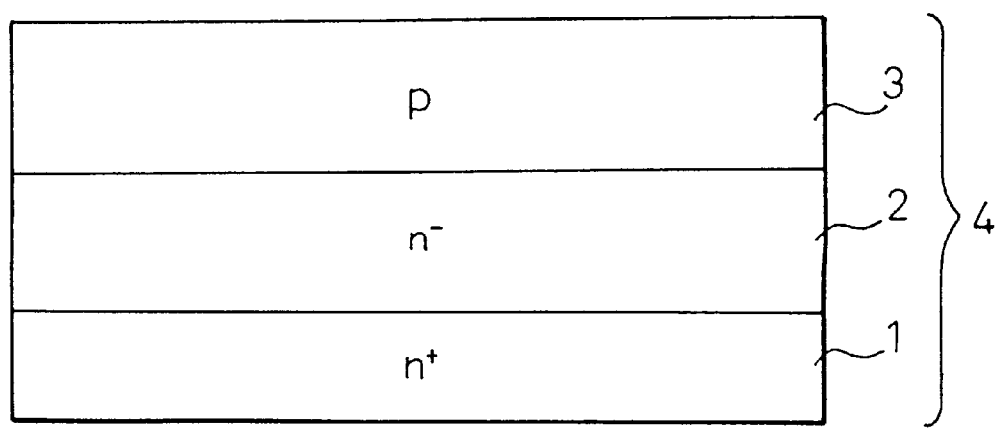
FIGS. 2 to 8 are cross-sectional views showing a process for producing the silicon carbide semiconductor device shown in FIG. 1.

At the outset, as shown in FIG. 2, an n⁺ type single crystal SiC substrate 1 is provided as a low-resistance semiconductor layer. The n⁺ type single crystal SiC substrate 1 is of hexagonal system and has a surface having a carbon face with a substantially (000$\bar{1}$) face orientation. An n⁻ type silicon carbide semiconductor layer 2 as a high-resistance semiconductor layer and a p type epitaxial layer 3 as a first semiconductor layer are laminated on the surface of the n⁺ type single crystal SiC substrate 1. The n⁻ type silicon carbide semiconductor layer 2 has a carrier density of about $1 \times 10^{16}$ cm⁻³ and a thickness of about 10 μm. On the other hand, the p type silicon carbide semiconductor layer 3 has a carrier density of about $1 \times 10^{17}$ cm⁻³ and a thickness of about 2 μm.

Thus, a semiconductor substrate 4 consisting of an n⁺ type single crystal SiC substrate 1, an n⁻ type silicon carbide semiconductor layer 2, and a p type silicon carbide semiconductor layer 3 is formed.

Figure 3:
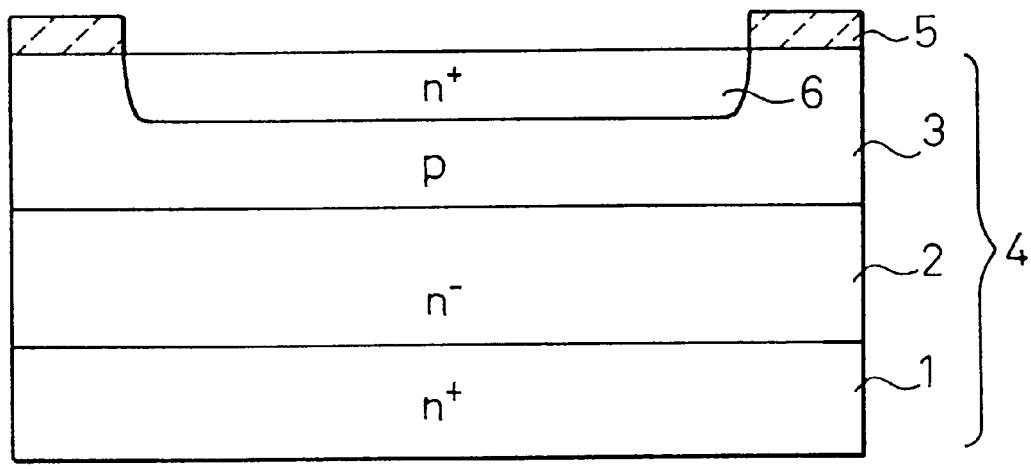

Subsequently, as shown in FIG. 3, an n⁺ source region 6 is formed as a semiconductor region in a predetermined region in the surface layer portion of the p type silicon carbide semiconductor layer 3, for example, by ion implantation using a mask 5 on the p type silicon carbide semiconductor layer 3. The n⁺ source region 6 has a surface carrier density of about $1 \times 10^{19}$ cm⁻³ and a junction depth of about 0.5 μm.

In this case, since the n⁺ source region 6 is formed by ion implantation, it can be formed in any site of the p type silicon carbide semiconductor layer 3, enabling the percentage area of each surface of the p type silicon carbide semiconductor layer 3 (that is, body layer) and the source region 6 to be freely designed.

Figure 4:
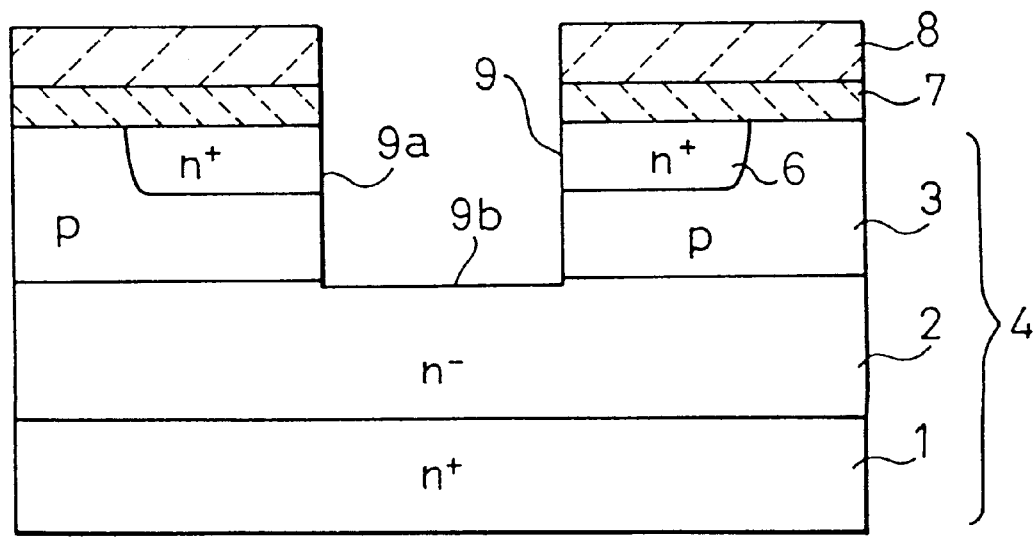

Thereafter, as shown in FIG. 4, a trench 9, which extends, from the surface of the semiconductor substrate 4, through the n⁺ type source region 6 and the p type silicon carbide semiconductor layer 3 into the n type silicon carbide semiconductor layer 2, is formed by dry etching using mask materials 7, 8. The trench 9 has a width of, for example, 2 μm and a depth of, for example, 2 μm. Further, the inner wall of the trench 9 has a side face 9a and a bottom face 9b.

Figure 5:
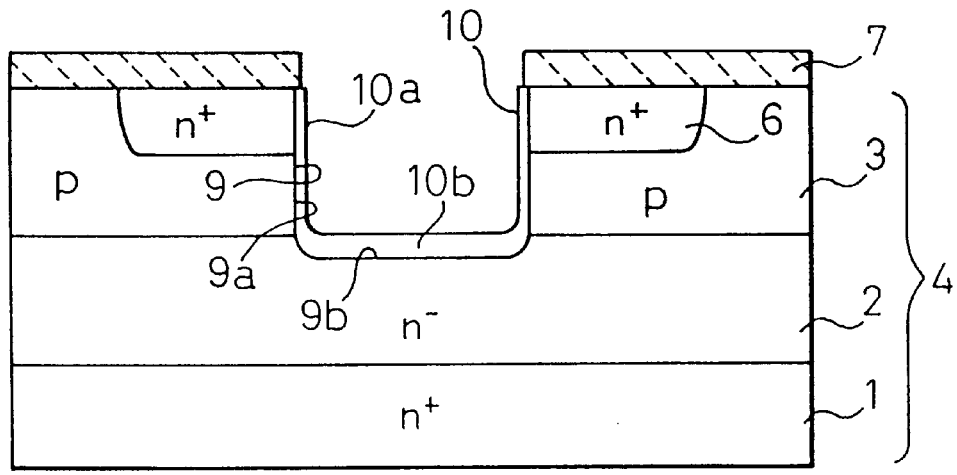

Thereafter, as shown in FIG. 5, for example, thermal oxidation at 1100° C. for, for example, about 5 hr is performed using a mask material 7 as a non-oxidizable mask, thereby forming an oxide layer 10, formed by thermal oxidation, on the inner wall of the trench 9. In this case, an about 100 nm-thick oxide layer 10a is formed on the side face 9a of the trench 9, while an about 500 nm-thick oxide layer 10b is formed on the bottom face 9b of the trench 9. Further, the oxide layer 10 and the mask material 7 are removed by etching.

Figure 6:
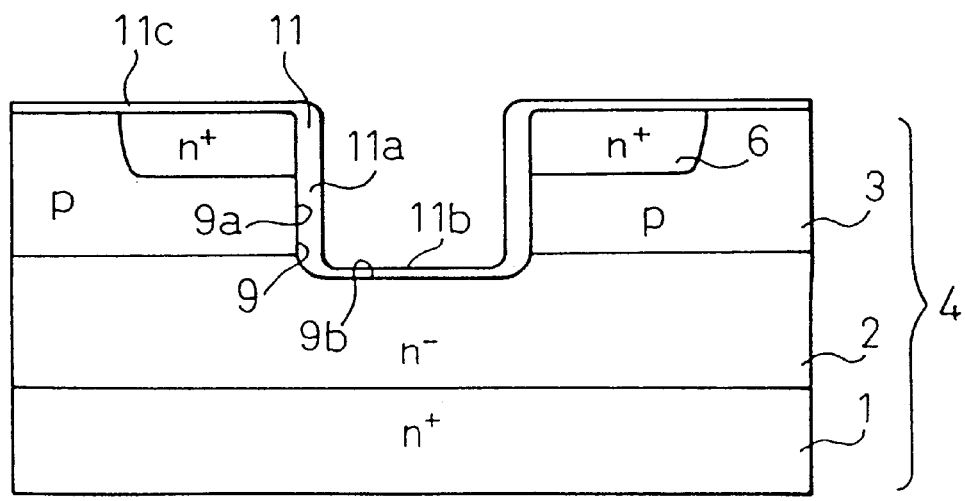

Subsequently, as shown in FIG. 6, an epitaxial layer (thin n type silicon carbide semiconductor layer) 11 as a second semiconductor layer is formed on the inner wall of the trench 9 and the surface of the n⁺ type source region 6 and the p type silicon carbide semiconductor layer 3 by epitaxial growth utilizing CVD. The epitaxial growth may be, for example, homoepitaxial growth wherein a thin layer 11 of 6H-SiC is grown on 6H-SiC. The epitaxial growth results in the formation of an epitaxial layer (a thin n type silicon carbide semiconductor layer) 11a having a thickness of, for example, about 100 nm on the side face 9a of the trench 9 and an epitaxial layer 11b having a thickness of, for example, about 10 nm on the bottom face 9b of the trench 9, and an epitaxial layer 11c having a thickness of about 10 nm on the surface of the substrate.

The epitaxial layer 11 is controlled to any desired impurity concentration. More specifically, in the vapor growth of silicon carbide by CVD while introducing a SiH₄ gas and C₃H₈ as starting gases, the regulation of the flow rate of the N₂ gas (or trimethylaluminum gas) permits the impurity concentration of the epitaxial layer 11 to be adjusted in the range of from $10^{15}$ to $10^{17}$/cm³. In this case, the impurity concentration can be lowered.

Figure 10:
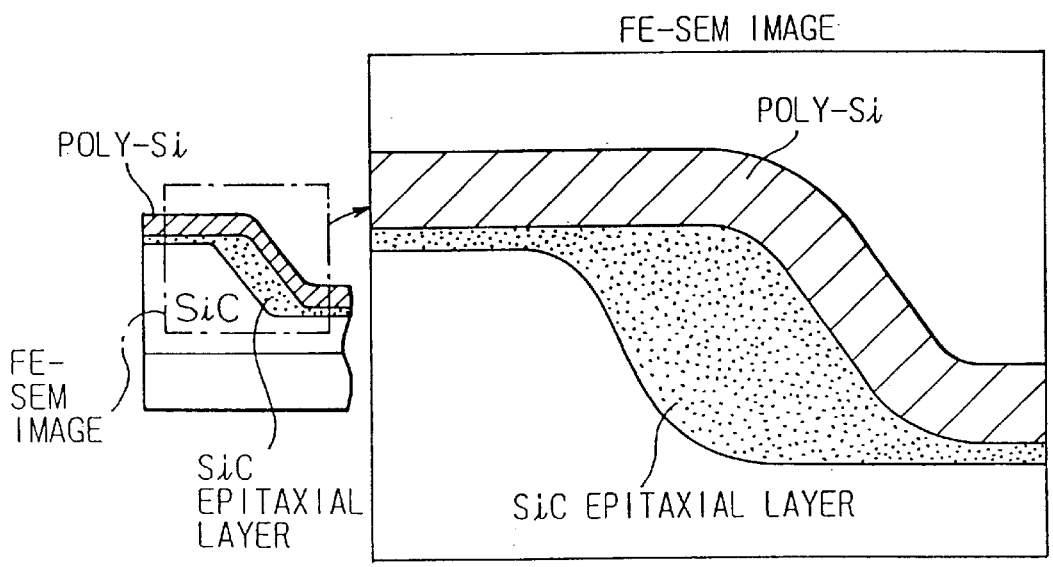
FIG. 10 is a schematic view showing the anisotropy of epitaxial growth of a silicon carbide semiconductor material.

In this connection, an experiment has revealed that epitaxial layers 11 having different thickness are formed. This is shown in FIG. 10. FIG. 10 is a sketch of an FE-SEM image in a region including the side face and bottom face in the trench. A difference in epitaxial growth rate of silicon carbide enables homoepitaxial growth to be performed on the side face of the trench so that the thickness of the homoepitaxial layer on the side face of the trench is 10 times or more larger than that of the epitaxial layer on the surface of the substrate and on the bottom face of the trench. Therefore, a device can be produced, in a high yield, which, although the epitaxial layer 11 serves as a channel forming region, can lower the voltage drop of the channel and has low loss.

As described above, the formation and removal of an oxide layer 10 (the formation and removal of a relatively thin oxide layer 10 by local anisotropic thermal oxidation) offers a trench, free from ion damage, on the inner wall of the trench 9. Therefore, the epitaxial layer 11a formed on the side face of the trench has a high quality, and the MOS interface formed in the epitaxial layer 11 is good, enabling the production of a device having excellent switching properties.

Figure 7:
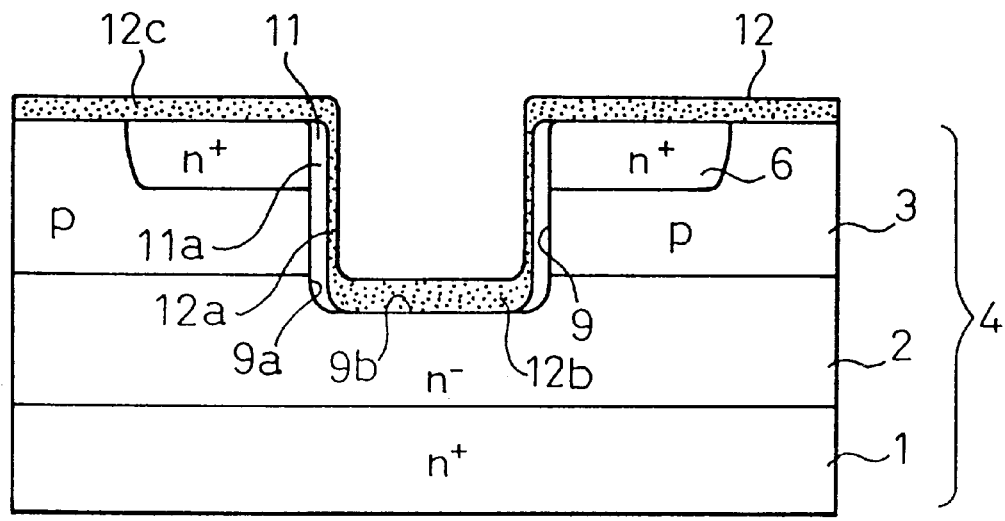

Then, as shown in FIG. 7, for example, anisotropic thermal oxidation at 1100° C. for, for example, about 5 hr is performed to form a gate oxide layer 12 on the surface of the epitaxial layer 11. In this case, an about 100 nm-thick thin gate oxide layer 12a is formed on the surface of the epitaxial layer 11a located on the side face 9a of the trench 9. On the other hand, the epitaxial layer 11b in the bottom face 9b of the trench 9 is oxidized and converted to an oxide film, thereby forming an about 500 nm-thick thick gate oxide layer 12b. Further, the epitaxial layer 11c on the n⁺ source region 6 and on the p type silicon carbide semiconductor layer 3 is converted to an oxide layer, thereby forming an about 500 nm-thick thick gate oxide layer 12c.

Figure 9:
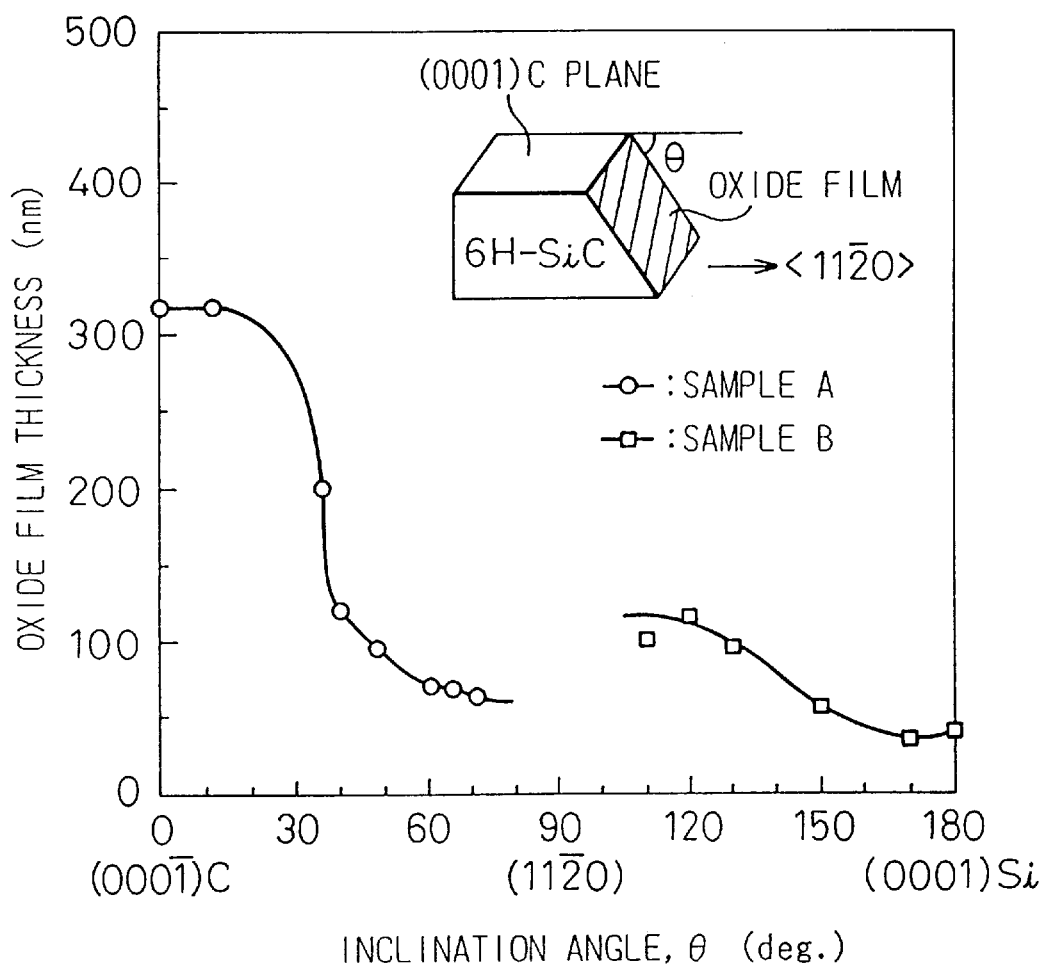
FIG. 9 is a graph showing the anisotropy of thermal oxidation of a silicon carbide semiconductor material.

In this case, an experiment has revealed that oxide layers 12 having different thickness are formed. Specifically, as shown in FIG. 9, the thickness of the oxide layer formed by thermal oxidation was measured using a silicon carbide having a carbon face with a (000$\bar{1}$) face orientation and a slanted face with a slant angle θ. As a result, the layer thickness in the face of θ=90° {(112 bar 0) face} is smaller than that in the carbon face with (000$\bar{1}$) face orientation. This anisotropic oxidation can minimize the removal of the necessary epitaxial layer 11 and can remove the unnecessary epitaxial layer 11 on the surface of the substrate and the bottom face of the trench. Therefore, the epitaxial layer 11 can be formed on only the side face by single thermal oxidation in a simple manner at a high yield, enabling a device to be produced at a low cost and a high yield.

Figure 8:
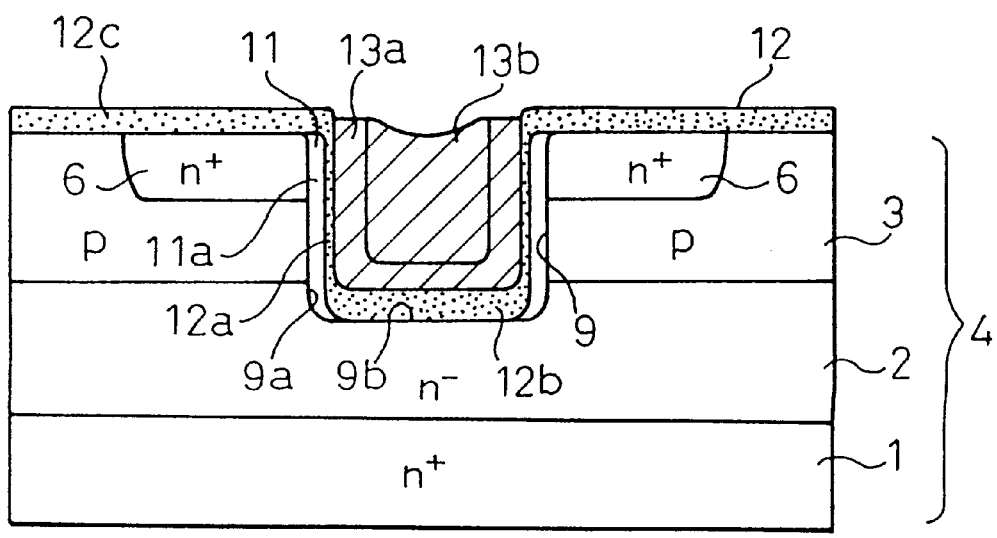

Subsequently, as shown in FIG. 8, the interior of the trench 9 is filled successively with a first polysilicon layer 13a and a second polysilicon layer 13b as a gate electrode layer. Thus, the first and second polysilicon layers 13a, 13b are disposed inside the gate oxide layer 12 within the trench 9. In this case, the first and second polysilicon layers 13a, 13b may be formed on the gate oxide layer 12c on the n⁺ source region 6.

Thereafter, as shown in FIG. 1, a layer-insulation layer 14 is formed, by CVD, on the gate oxide layer 12c, including the surface of the first and second polysilicon layers 13a, 13b. The gate oxide layer 12c and the layer-insulation layer 14 which are located on the surface of the n⁺ type source region 6 and the p type silicon carbide semiconductor layer 3, are removed in a predetermined position where a source contact is to be provided. Thereafter, a source electrode layer 15 is formed as a first electrode on the n⁺ type source region 6, the p type silicon carbide semiconductor layer 3, and the layer-insulation layer 14, and, further, a drain electrode layer 16 is formed as a second electrode on the back surface of the semiconductor substrate 4 (bottom surface of the n⁺ type single crystal SiC substrate 1), thereby completing a power MOSFET.

Thus, according to the present embodiment, the impurity concentration of the epitaxial layer 11a, wherein a channel is formed using a semiconductor substrate 4 of silicon carbide, can be desirably designed independently of the concentration of an impurity in the n⁻ type silicon carbide semiconductor layer 2 and the p type silicon carbide semiconductor layer 3. As a result, it is possible to provide a high blocking voltage and low loss power MOSFET which has a lowered drop voltage in the channel portion by virtue of suppressed impurity scattering in the channel mobility and a low threshold voltage.

Since the epitaxial layer 11a is formed within the trench 9, a semiconductor layer free from ion damage can be provided in the epitaxial layer 11a. Thus, reduced ion damage and irregularities on the channel formed face can provide a silicon carbide semiconductor device having improved MOS interface properties and excellent switching properties.

Since the silicon carbide constituting the semiconductor substrate 4 is of hexagonal system with the surface thereof having a carbon face with a substantially (0001) face orientation, the chemical reactivity of the surface is higher than that of the other faces, enabling the process temperature to be lowered and, at the same time, the process time to be shortened. Thus, an inexpensive device can be provided.

Since the second semiconductor layer (epitaxial layer 11a) for forming a channel has been formed by epitaxial growth, a high-quality second semiconductor layer (epitaxial layer 11a) can be uniformly formed on the side face of the trench 9. The second semiconductor layer (epitaxial layer 11a) formed by this method has a feature in that the mobility is not influenced by the impurities of the other layers and, hence, is high. Therefore, the voltage drop of the channel formed in the epitaxial layer 11a can be lowered, enabling a low-loss device to be produced. Further, anisotropic epitaxial growth in a low impurity concentration results in the formation of a channel having high mobility, reducing the drop voltage in the channel portion. Thus, a high blocking voltage and low loss power MOSFET of silicon carbide can be produced so as to further reduce the loss in a high yield.

Further, the formation of the trench 9 by dry etching enables the trench 9 to be finely, deeply and substantially perpendicularly formed, and increasing the surface area of the epitaxial layer 11a formed on the side face 9a of the trench 9 can increase the total channel width per unit area and lower the voltage drop of the channel portion. Thus, a device having further reduced loss can be produced.

Since the gate electrode layer is a polysilicon film, the gate electrode layer can be formed on the inner wall of the trench in a high yield. Thus, a high blocking voltage and low loss device can be produced at a high yield.

Although only silicon carbide of hexagonal system has been described in this example, other crystal systems (for example, a cubic system) also can offer the same effect.

Further, although only the substrate having a p/n/n⁺ structure has been described in this example, it is needless to say that the same effect can be attained by a structure wherein the n type in the semiconductor type has been replaced with the p type.

Further, as shown in FIG. 7, after the formation of an epitaxial layer 11, an oxide layer is formed by thermal oxidation to leave the epitaxial layer 11 on only the side face of the trench 9 and to dispose the oxide layer, on the inner wall of the trench 9, with the thickness thereof on the side face 9a of the trench 9 being smaller than that on the bottom face 9b. Alternatively, the thermal oxidation may be conducted in two steps, that is, a step of forming a first oxide layer which comprises, after the formation of the epitaxial layer 11, forming an oxide layer, leaving the epitaxial layer 11 on only the side face of the trench 9 and removing the oxide layer, and a step of forming a second oxide layer which comprises, after the formation of the first oxide layer, forming an oxide layer on the inner wall of the trench 9 with the thickness thereof on the side face 9a being smaller than that on the bottom face 9b. In the step of forming the first oxide layer, the unnecessary second semiconductor on the surface of the substrate can be removed by single oxidation. Further, in the step of forming the second oxide layer, the oxide layer on the side face can be selectively formed thin by anisotropic thermal oxidation, with the thickness of the field oxide layer on the surface of the substrate and on the bottom face of the trench being large. Thus, a thin oxide layer can be formed at only a site where the channel is created.

The n⁺ source region 6 may be formed on the surface of the p type silicon carbide semiconductor layer 3, without relying on ion implantation, by introducing, in the course of growth in the formation of the p type silicon carbide semiconductor layer 3, a gas containing an impurity. This enables the formation of a thick source region, and the low-resistance source region can be formed by epitaxial growth to lower the drop voltage in the source region. Thus, a device having further lowered loss can be produced.

The formation of the source electrode layer 15 on at least the surface of the n⁺ source region 6 suffices for the object of the present invention.

The epitaxial layer 11 shown in FIG. 6 has been formed by epitaxial growth of 6H-SiC on 6H-SiC. Alternatively, 4H-SiC or 3C-SiC may be epitaxially grown on 6H-SiC.

In the present invention, the carbon face with (000$\bar{1}$) face orientation includes a carbon face with (0001) face orientation which is a crystallographically symmetrical face.

EXAMPLE 2

Figure 11:
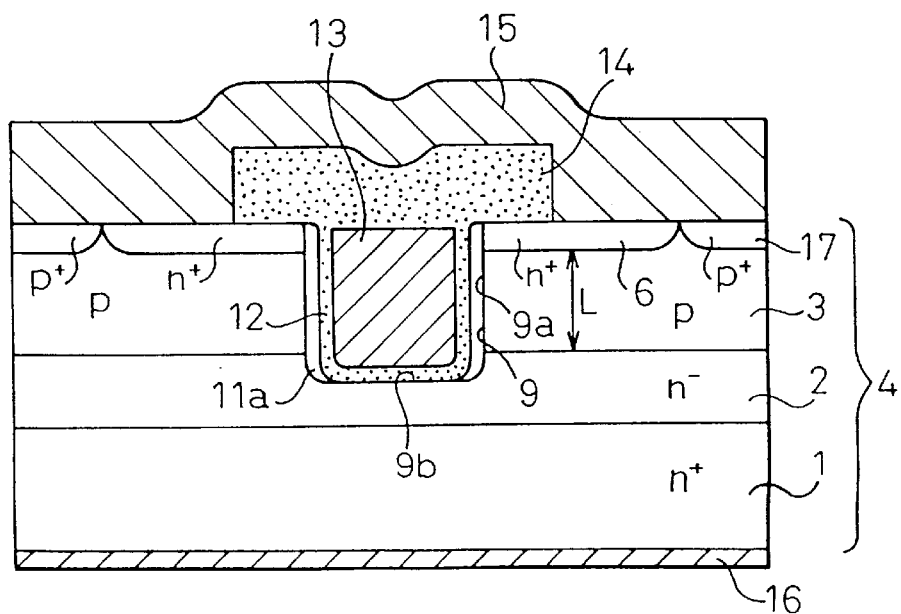
FIG. 11 is a cross-sectional view showing the structure of a silicon carbide semiconductor device according to a second embodiment of the present invention.

FIG. 11 shows a cross-sectional view of a power MOSFET of silicon carbide according to the second embodiment of the present invention. According to this embodiment, the trench 9 is filled with the gate electrode layer 13 in a single step. Further, a low-resistance p type silicon carbide region 17 for improving the contact with the source electrode layer 15 is formed in a different predetermined region in the surface layer portion of the p type silicon carbide semiconductor layer 3, for example, by ion implantation of aluminum.

Besides the above constructions, for example, the material for the n⁺ type source region 6 may be different from that for the source electrode layer 15 formed in the low-resistance p type silicon carbide region 17. Further, as shown in FIG. 1, the low-resistance p type silicon carbide region 17 may be omitted. In this case, the source electrode layer 15 may be formed so as to come into contact with the n⁺ type source region 6 and the p type silicon carbide semiconductor layer 3. The formation of the source electrode layer 15 on at least the surface of the n⁺ type source region 6 suffices for the object of the present invention.

Further, although the application to n channel vertical MOSFET has been described above, the replacement of p type and n type with each other in FIG. 1, that is, p channel type vertical MOSFET, also can offer the same effect.

EXAMPLE 3

Figure 12:
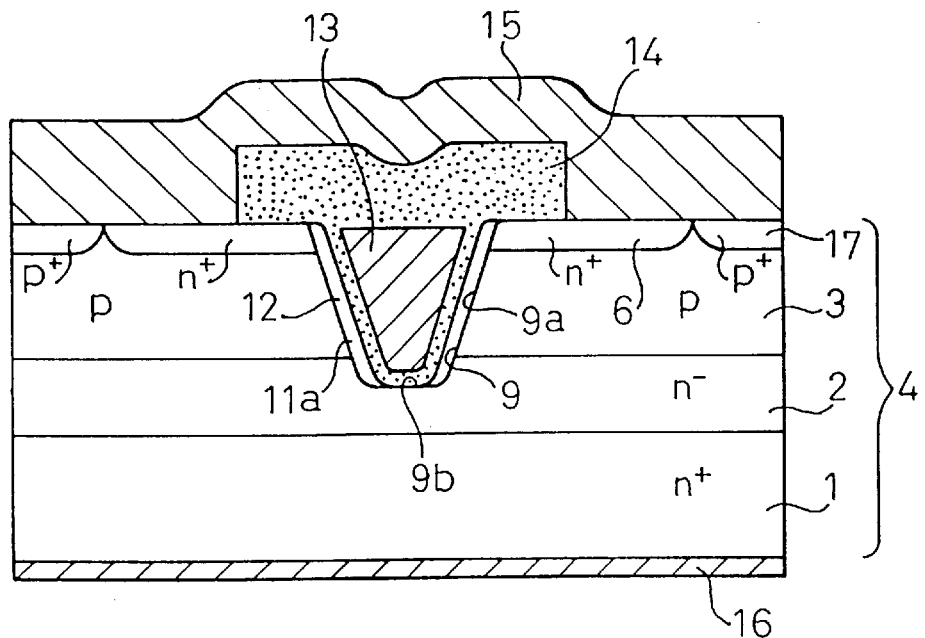
FIG. 12 is a cross-sectional view showing the structure of a silicon carbide semiconductor device according to a third embodiment of the present invention.

In FIG. 1, the angle of the side face 9a in the trench 9 to the surface of the substrate is 90°. However, as shown in FIG. 12, the angle of the side face 9a in the trench 9 to the surface of the substrate may not be necessarily 90°. Further, the trench 9 may be in a V form having no bottom face.

A better effect can be attained when the angle of the side face of the trench 9 to the surface of the substrate 4 is designed so as to provide high channel mobility.

EXAMPLE 4

Figure 13:
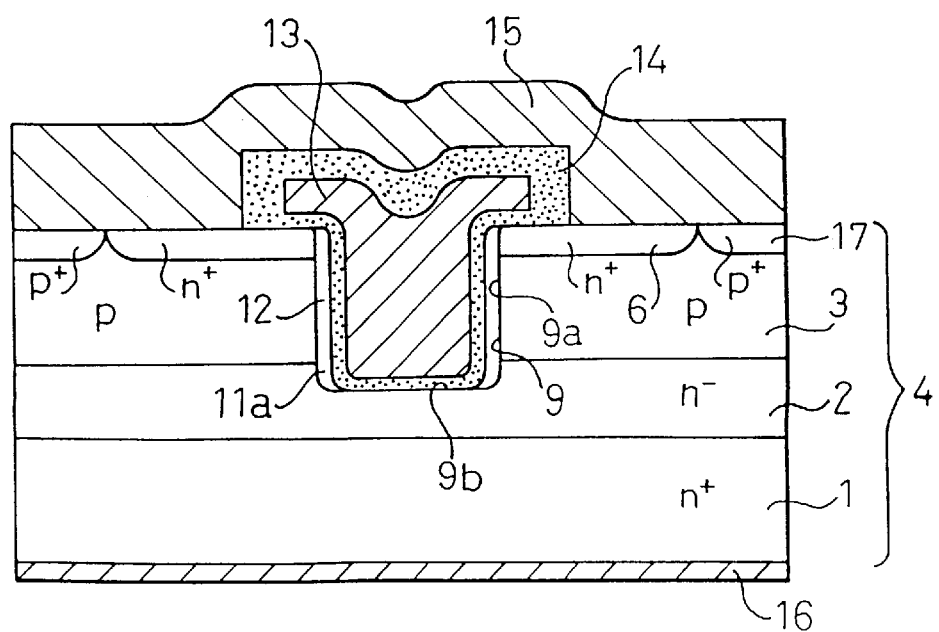
FIG. 13 is a cross-sectional view showing the structure of a silicon carbide semiconductor device according to a fourth embodiment of the present invention.

As shown in FIG. 13, the upper portion of the gate electrode layer 13 may be formed so as to extend on the n⁺ type source region 6. This construction can reduce the connection resistance between the n⁺ type source region 6 and the channel induced in the thin n type silicon carbide semiconductor layer 11a.

EXAMPLE 5

Figure 14:
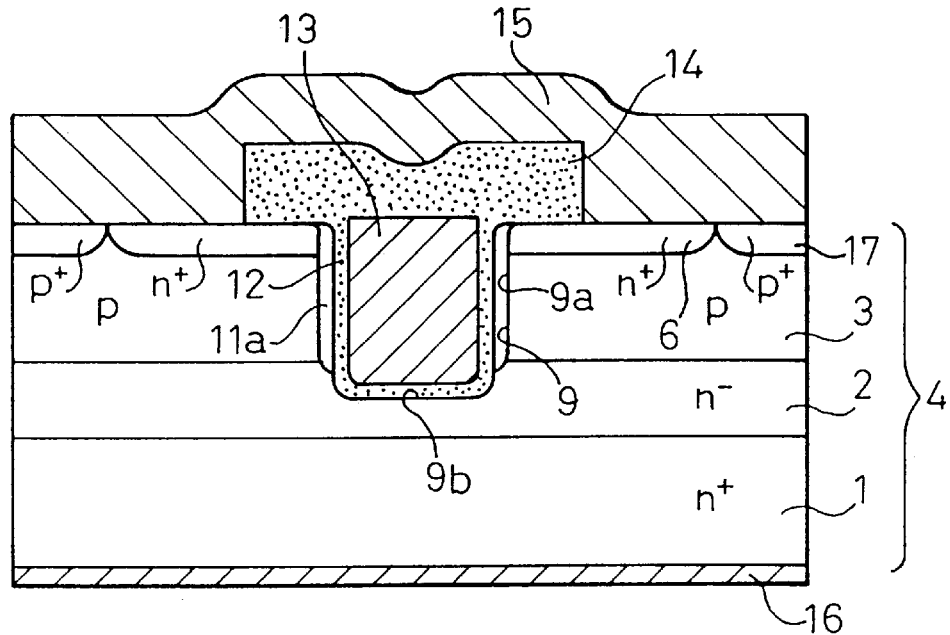
FIG. 14 is a cross-sectional view showing the structure of a silicon carbide semiconductor device according to a fifth embodiment of the present invention.

As shown in FIG. 14, the construction of the device may be such that the thickness of the gate insulating layer 12 is substantially identical in the central portion and the lower end of the thin n type silicon carbide semiconductor layer 11a wherein the channel is formed, and the gate electrode layer 13 extends toward a position lower than the lower end of the thin n type silicon carbide semiconductor layer 11a. This construction can reduce the connection resistance between the channel induced in the thin n type silicon carbide semiconductor layer 11a and the drain region.

EXAMPLE 6

Figure 15:
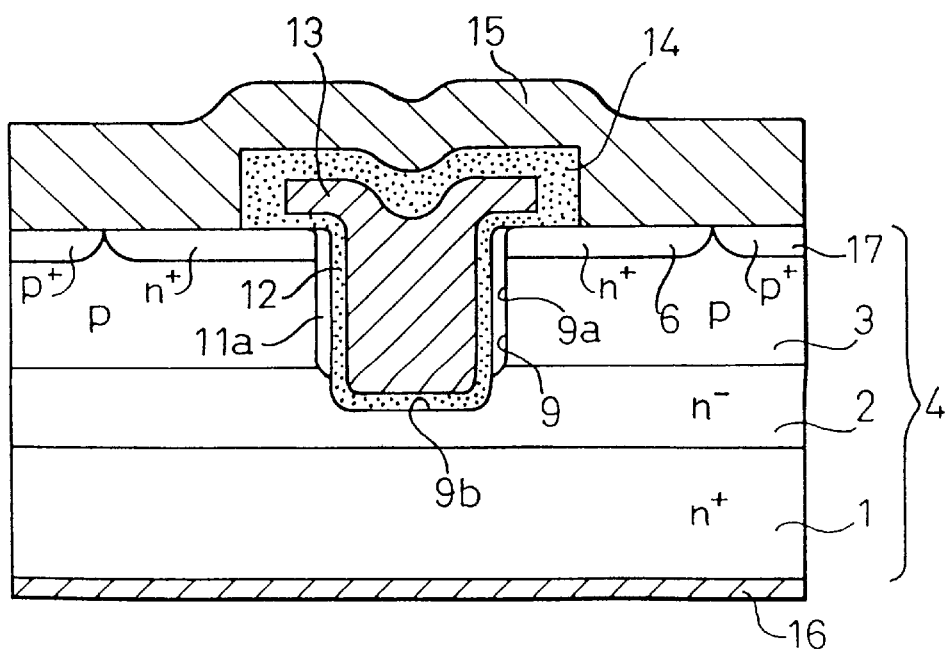
FIG. 15 is a cross-sectional view showing the structure of a silicon carbide semiconductor device according to a sixth embodiment of the present invention.
Figure 16:
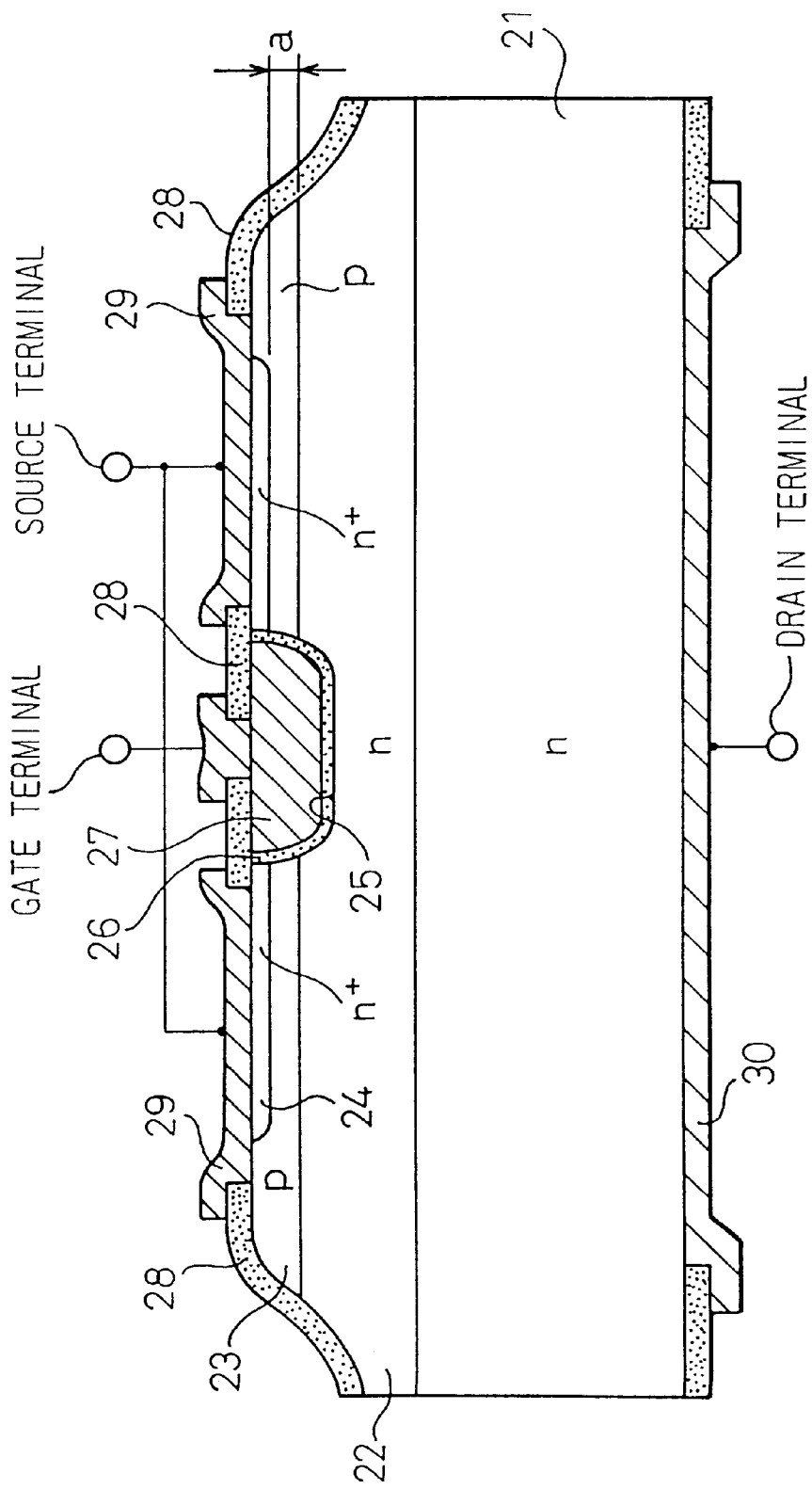
FIG. 16 is a cross-sectional view showing the structure of a Conventional silicon carbide semiconductor device.

The construction of the device may be as shown in FIG. 15. Specifically, as shown in FIG. 13, the upper part of the gate electrode layer 13 is formed so as to extend on the n⁺ type source region 6, and, as shown in FIG. 14, the gate electrode layer 13 extends toward a position lower than the lower end of the thin n type silicon carbide semiconductor layer 11a.

Further, the thin n type silicon carbide semiconductor layer 11a and the p type silicon carbide semiconductor layer 3 are different from each other in crystal form. For example, the p type silicon carbide semiconductor layer 3 may be formed of 6H-SiC with the thin n type silicon carbide semiconductor layer 11a being formed of 4H-SiC to increase the mobility of the carrier flow direction, thereby offering a MOSFET having a low current loss.

Further, in the above embodiments, a semiconductor layer which serves as an accumulation type channel has been used as the second semiconductor layer. Alternatively, a semiconductor layer which serves as an inversion type channel may be used as the second semiconductor layer.

This will be described with reference to FIG. 1. A thin p type silicon carbide semiconductor layer 11a having a concentration lower (for example, $10^{15}$–$10^{16}$ cm$^{-3}$) than the p type silicon carbide semiconductor layer 3 is formed. In this case as well, the same effect as attained by the accumulation type channel can be obtained. The device having this structure can be produced in the same manner as described above.

In this case, the application of a voltage to the gate electrode layers 13a, 13b causes the thin p type silicon carbide semiconductor layer 11a in the portion near the surface in contact with the gate insulating layer 12 to be inverted to n type to permit the portion between the n⁺ type source region and the n⁻ type silicon carbide semiconductor layer 2 to become electrically conductive, resulting in the flow of a current through between the source and the drain (between the source electrode layer 15 and the drain electrode layer 16).

In the formation of an inversion type channel, for example, as shown in FIG. 15, preferably, the gate electrode layer 13 is formed to extend on the n⁺ type source region 6 and the n⁻ type silicon carbide layer 2 so that the n⁺ type source region 6 is satisfactorily connected to the n⁻ type silicon carbide semiconductor layer 2 by the inversion type channel.

The crystal form of the thin p type silicon carbide semiconductor layer 11a may be the same as that of the p type silicon carbide semiconductor 3 (for example, 6H-SiC). In addition to this, the crystal form may be 4H-SiC or 3C-Sic.

Further, in the above embodiments, the application to an n channel vertical MOSFET has been described. The replacement of p type and n type with each other in FIG. 1, that is, p channel vertical MOSFET, offers the same effect.

Modifications and variations, other than those described above fall within the scope of the present invention, unless they deviate from the subject matter of the present invention.

We claim:

1. A process for producing a silicon carbide semiconductor device, comprising: a first step of laminating a first conductive type low-resistance semiconductor layer, a first conductive type high-resistance semiconductor layer, and a second conductive type first semiconductor layer in that order on top of one another to form a semiconductor substrate of a single crystal silicon carbide and forming a first conductive type semiconductor region in a predetermined region of the surface portion in the first semiconductor layer;

a second step of forming a trench extending through the semiconductor region and the first semiconductor layer into the high-resistance semiconductor layer;

a third step of forming a second semiconductor layer, formed of a single crystal silicon carbide, on at least the side face of the inner wall of the trench;

a fourth step of forming a gate oxide layer on the surface of the second semiconductor layer in the trench;

a fifth step of forming a gate electrode on the surface of the gate oxide film in the trench; and a sixth step of forming a first electrode on the surface of the semiconductor region and optionally on the surface of the first semiconductor layer and forming a second electrode on the surface of the low-resistance semiconductor layer.

2. The process according to claim 1, wherein the silicon carbide constituting the semiconductor substrate is of the hexagonal system and the surface of the semiconductor substrate has a carbon face with a substantially $(000\bar{1})$ face orientation.

3. The process according to claim 1, wherein, in the third step, the second semiconductor layer is formed on the surface of the first semiconductor layer and the semiconductor region and the side face and bottom of the trench and, thereafter, the second semiconductor layer on the surface of the first semiconductor layer and the semiconductor region and the bottom of the trench is thermally oxidized deeper than the second semiconductor layer on the side face of the trench to leave the second semiconductor layer on only the side face of the trench.

4. The process according to claim 1, wherein, in the third step, the second semiconductor layer is formed by epitaxial growth.

5. The process according to claim 1, wherein, in the first step, the semiconductor region is formed by epitaxial growth.

6. The process according to claim 1, wherein the second step involves the formation of the trench by dry etching and the formation and removal of an oxide layer on the inner wall of the trench, the thickness of the oxide layer on the side face being smaller than that of the oxide layer on the bottom.

7. The process according to claim 2, wherein, in the third step, the second semiconductor layer is formed on the inner wall of the trench by anisotropic epitaxial growth on the inner wall of the trench so that the thickness of the second semiconductor layer on the side face is larger than that of the second semiconductor layer on the bottom.

8. The process according to claim 7, wherein, in the fourth step, the gate oxide layer is formed on the inner wall of the trench by anisotropic thermal oxidation so that the thickness of the gate oxide layer on the side face is smaller than that of the gate oxide layer on the bottom face.

9. A process for producing a semiconductor device using silicon carbide, comprising the steps of:

preparing a silicon carbide substrate having a surface of a $(000\bar{1})$ carbon face;

forming a trench on the surface of the $(000\bar{1})$ carbon face;

forming a semiconductor layer on bottom and side surfaces of the trench; and thermally oxidizing the semiconductor layer such that the semiconductor layer formed on the bottom surface of the trench is entirely converted to an oxide layer while the semiconductor layer formed on the side surface of the trench is partially converted to an oxide layer to leave a thinned semiconductor layer interposed between the oxide layer converted from the semiconductor layer on the side surface of the trench and the side surface of the trench.

10. A process for producing a MOS transistor, comprising the steps of:

laminating a first semiconductor layer of a first conductivity type and a second semiconductor layer of a second conductivity type to provide a semiconductor substrate composed of silicon carbide and having a surface of a $(000\bar{1})$ carbon face of the second semiconductor layer of the second conductivity type;

forming a trench extending from the surface to the first semiconductor layer of the first conductivity type;

forming a third semiconductor layer at least on the bottom and side surfaces of the trench;

thermally oxidizing the third semiconductor layer such that the third semiconductor layer formed on the bottom surface of the trench is entirely converted to an oxide layer while the third semiconductor layer formed on the side surface of the trench is partially converted to an oxide layer as a gate oxide layer of a MOS transistor to leave a thinned third semiconductor layer as a channel region of the MOS transistor interposed between the oxide layer converted from the third semiconductor layer on the side surface of the trench and the side surface of the trench; and forming a gate electrode in the trench.

* * * * *